(12) United States Patent
Langley

(10) Patent No.: US 6,424,733 B2
(45) Date of Patent: *Jul. 23, 2002

(54) METHOD AND APPARATUS FOR INSPECTING WAFERS

(75) Inventor: Rodney C. Langley, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/118,835

(22) Filed: Jul. 20, 1998

(51) Int. Cl.⁷ .................................................. G06K 9/00
(52) U.S. Cl. ........................ 382/145; 382/153; 348/125
(58) Field of Search ................................. 382/141, 143, 382/144, 145, 146, 147, 149, 150, 151; 348/86, 87, 125, 126; 364/468.02; 356/237, 237.3; 250/310; 29/840

(56) References Cited

U.S. PATENT DOCUMENTS

| | | |
|---|---|---|
| 5,228,206 A | 7/1993 | Grant et al. |
| 5,280,219 A | 1/1994 | Ghanbari |
| 5,370,739 A | 12/1994 | Foster et al. |
| 5,380,682 A | 1/1995 | Edwards et al. |
| 5,634,268 A * | 6/1997 | Dalal et al. ................... 29/840 |
| 5,655,060 A | 8/1997 | Lucas |
| 5,777,327 A * | 7/1998 | Mizuno ...................... 250/310 |
| 5,909,276 A * | 6/1999 | Kinney et al. ............... 356/237 |
| 6,020,957 A * | 2/2000 | Rosengaus et al. ...... 356/237.3 |

* cited by examiner

Primary Examiner—Joseph Mancuso
Assistant Examiner—Vikkram Bali
(74) Attorney, Agent, or Firm—Dickstein Shapiro Morin & Oshinsky LLP

(57) ABSTRACT

A cluster tool includes an inspection station for inspecting semiconductor wafers. The cluster tool includes a plurality of process/reaction chambers and an inspection chamber coupled thereto. A transport module provides a transport mechanism for transporting the semiconductor wafer from the process/reactio chamber to the inspection chamber. The inspection chamber includes a light source, a light receiver, and an image processor. The light source illuminates the semiconductor wafer with a beam of light and the receiver receives a reflected image. The processor processes the received image to detect a defect and provides a warning signal to an operator when a defect is detected.

23 Claims, 3 Drawing Sheets

METHOD AND APPARATUS FOR INSPECTING WAFERS

The present invention relates to methods and apparatus for inspecting wafers.

In particular, the invention relates to apparatus disposed in single and multi-chamber cluster tools for inspecting wafers.

BACKGROUND OF THE INVENTION

During conventional fabrication of semiconductor wafers, cluster tools transport the wafer between various stations, such as, for example, a chemical vapor deposition station or an etching station. After fabrication, the wafer is transported from the cluster tool to an inspection station and inspected for surface defects, line width, electrical functions, and the like.

Generally, wafers are not individually inspected because of the disparity between the throughputs of the fabrication machinery and the inspection machinery. Individual inspection for each wafer would either require a prohibitive amount of inspection machinery to maintain adequate throughput, or result in an unacceptable loss of productivity. Accordingly, wafers are sampled for inspection, with the sampling rate and selection method being based on the process involved.

Empirically, manufacturers know that certain processes are more stable than others, and select the sampling rates for each process accordingly. For example, some processes are very stable and, once the process is adjusted to produce parameters that are within the inspection criteria, the parameters do not vary greatly over time. In these cases, once the process is adjusted, the processing machinery can operate relatively autonomously for days at a time. Thus, stable processes do not require a high sampling rate. Other, less stable, processes require a higher sampling rate.

Generally, wafers are processed in lots of 20 to 25 wafers each, and usually with 4 to 5 lots processed between cleanings of the processing chambers. In the case of 300 mm wafers, the lot size is about 12–13 wafers. With a low sampling rate as used with more stable processes, it is possible for many wafers to complete the process having defects. For example, in an otherwise stable process, the process chamber may suffer an excursion, such as a blown o-ring or electrical arcing.

Accumulated process material, such as etchant or deposition material, may flake off the walls of the chamber onto the wafers. If the excursion occurs early in the first lot or shortly after a sampling, for example, the low sampling rate can produce enormous waste in terms of the number of defective wafers that consume processing time and material before the problem with the process is detected during the next sampling. A higher sampling rate could minimize this problem, but, as noted, productivity would suffer as a consequence.

Defects resulting from such casualties to the process chamber result in large scale defects, on the order of 0.5 micron in size. In the past, manufacturers have not inspected separately for such large defects because large defects are discovered during inspection for smaller defects. Yet these large scale defects account for a large proportion of defective wafers.

The smaller defects are typically caused by instabilities in the various processes, and the instabilities are factored into the sampling rate to minimize the number of defective wafers that go through processing before a sampling detects the problem. The larger defects, on the other hand, are generally unpredictable, being caused by a catastrophic breakdown, and can therefore cause the greatest loss in terms of waste.

Manufacturers are striving to detect ever smaller defects, such as 0.15 to 0.18 micron-sized defects. Unfortunately, the equipment necessary to detect these smaller defects is very large, expensive, complicated, and takes up a lot of valuable floor space.

In particular, as the detectable defect size shrinks, the corresponding inspection machinery increases in size, complexity, and cost. For example, in order to determine line width in the 0.15 to 0.18 Micron range, inspection machines require very large granite or marble tables to provide a stable, non-moving platform on which to perform the inspection. These tables are quite large and have a large footprint, taking up valuable manufacturing floor space. In addition, the large inspection machines have a reduced throughput. The reduced throughput requires a lower sampling rate which results in higher waste or lower productivity.

Moreover, as the wafer size increases towards the 300 millimeter size, the handling equipment necessary to move the wafers around also increases in size and complexity, with a resultant slowdown in handling speeds.

Thus, manufacturers would welcome a method and apparatus for a quick, real-time sampling of wafers. Quick, real-time sampling would allow a higher sampling rate while minimizing any adverse impact on throughput and result in early detection of large defects. Early detection of large defects would minimize the waste associated therewith by saving the remaining wafers in the lot from further processing, thereby saving time and material. Moreover, such real-time sampling would reduce the sampling burden on the large inspection machines or effectively increase their sampling rate.

SUMMARY OF THE INVENTION

The present invention overcomes these disadvantages and others by providing an inspection station coupled to the cluster tool. Coupling the inspection station to the cluster tool provides a method and apparatus for a quick, real-time sampling of wafers that would detect large defects sooner while minimizing any adverse impact on throughput.

According to the present invention, a semiconductor wafer inspection station comprises a cluster tool and an inspection station attached to the cluster tool. The inspection station includes an image detector for detecting an image of the semiconductor wafer, and a processor for processing the detected image to detect defects in the semiconductor wafer.

In preferred embodiments of the invention, an inspection chamber is attached to the cluster tool, and the inspection station is disposed in the inspection chamber. The inspection chamber includes a rotatable chuck and the inspection station includes a light source positioned to illuminate the semiconductor wafer when it is positioned on the chuck. An image detector is positioned for receiving light that is reflected by the semiconductor wafer and a processor is coupled to the image detector for processing the detected image to detect defects.

The present invention also provides a method of inspecting a semiconductor wafer. The method comprises the steps of providing a cluster tool, attaching an inspection station to the cluster tool, and positioning the semiconductor wafer at the inspection station for inspection. A light source illuminates the semiconductor wafer and a receiver receives a reflected image. A processor coupled to the receiver processes the image to detect defects. When the inspection detects a defect, the inspection station sends a warning to an operator. Thus, the invention provides for inspection of the semiconductor wafer before it leaves the cluster tool/ inspection station.

The present invention offers several advantages, such as reducing wafer loss and providing for improved sampling without hampering the throughput of the cluster tool. For example, after a process has taken place, the wafer is passed under a glancing laser-type apparatus which is controlled by the same software that controls the cluster tool. In the event a defect is detected, the tool can either shut down or provide a warning to an operator, thereby reducing wafer loss by preventing the processing of other wafers until the problem is corrected. If no defect is detected, the wafer continues with further processing steps, as necessary. If the wafers are sampled for testing, the uninspected wafers continue through the processing as before, leaving the throughput unaffected. However, a glancing laser-type apparatus can quickly detect a 0.5 micron defect, which allows a higher sampling rate, thereby reducing waste and increasing productivity. Importantly, the invention achieves these advantages without increasing the footprint of the equipment, thereby preserving valuable floor space.

These and other features and advantages of the invention will become apparent from the following detailed description of preferred embodiments of the present invention.

DETAILED DESCRIPTION OF THE DRAWINGS

Figure 1:
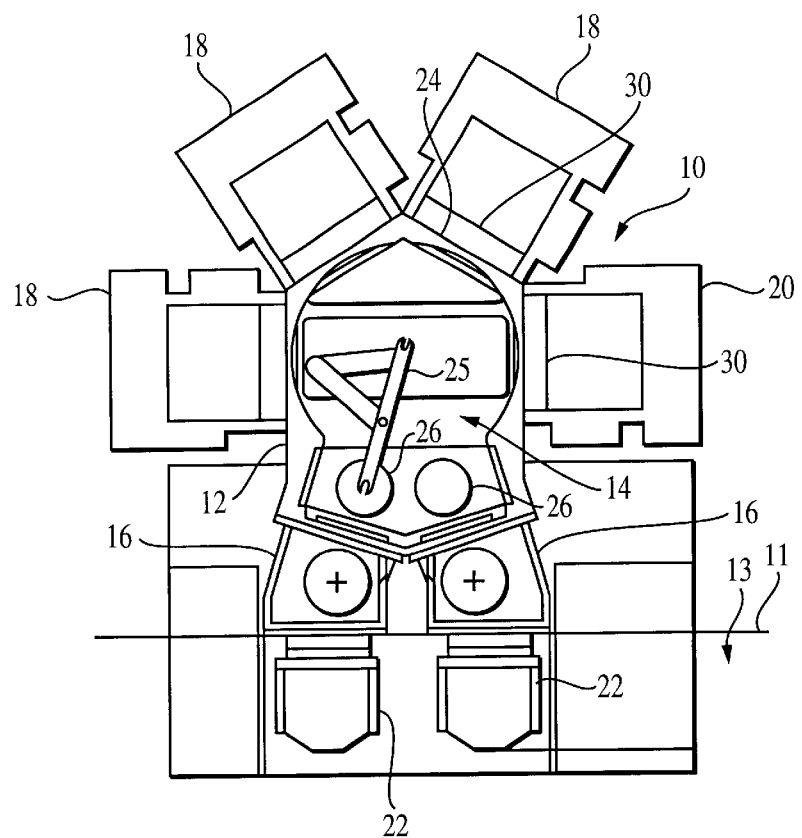
FIG. 1 illustrates a cluster tool with an inspection chamber according to the present invention.

As illustrated in FIG. 1, the present invention includes a cluster tool 10 coupled to the wall 11 of a clean room 13. The cluster tool 10 includes a housing 12 that defines an interior region 14, a plurality of conventional process/reaction chambers 18, and a conventional transport module 24 having a transport device 25 for. transporting a semiconductor wafer 26. The cluster tool 10 further includes an inspection chamber 20 coupled to the housing 12 and disposed to receive semiconductor wafers 26 for inspection. The process chambers 18 provide a suitable atmosphere for various processes used in the manufacture of the semiconductor wafer 26, such as deposition and etching. The housing 12 and inspection chamber 20 are maintained at a vacuum pressure level suitable for the processing of semiconductor wafers by vacuum pumps (not shown). The chambers 18, 20 are coupled to the housing 12 by commercially available gate valves 30 or the like. The gate valves 30 isolate the environments of the chambers 18, 20, from that of the housing 12. Load locks 16 provide vacuum/next capabilities for transferring a wafer from the cluster tool 10 to factory automation 22 in the clean room 13.

Figure 2:
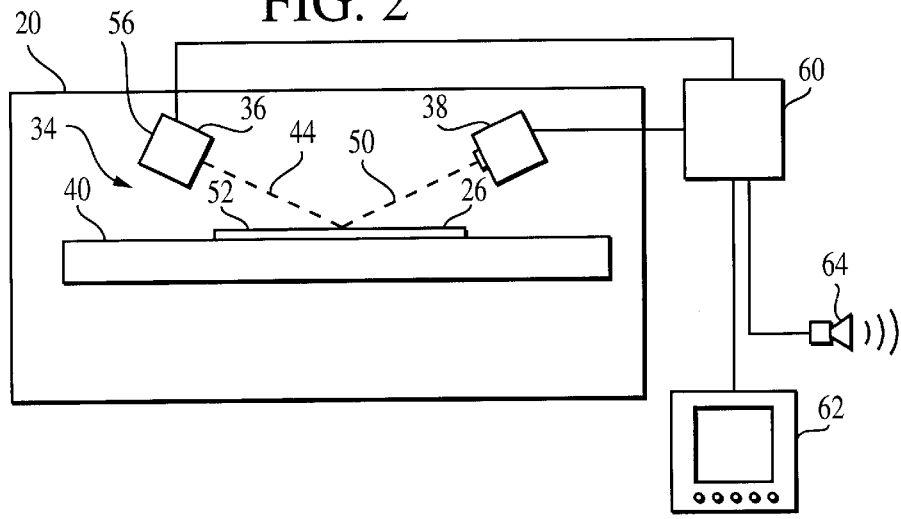
FIG. 2 illustrates an optical inspection station disposed inside the inspection chamber.

The inspection chamber 20 includes a conventional inspection station 34, shown in FIG. 2. In preferred embodiments of the invention, the inspection station 34 includes a light source 36, a light receiver 38, and a wafer-receiving chuck 40. The light source 36 is disposed in the chamber 20 to direct a beam of light 44 at a semiconductor wafer 26 mounted on the chuck 40 and the light receiver 38 is disposed to receive an image 50 reflected from the surface 52 of a semiconductor wafer 26 held by the chuck 40. A processor 60 is coupled to the light receiver 38 for receiving the image 50 and processing the image 50 for detecting defects. The processor 60 can be coupled to a display monitor 62 to provide information, such as inspection progress or a visual warning of defects noted, to an operator. The processor 60 can also be coupled to an audio warning device 64, to provide an audio warning to the operator.

In preferred embodiments, the light source 36 includes a laser 56. The laser 56 illuminates the entire surface 52 of the semiconductor wafer 26, either by a single steady beam or by a narrow beam that is swept back-and-forth across the surface 52. In one embodiment of the invention, the chuck 40 rotates the semiconductor wafer 26 while the laser 56 sweeps a beam of light back-and-forth, thereby illuminating the entire surface 52. As is known in the art, a laser inspection device is generally capable of discriminating defects down to about 0.2–0.5 microns.

Although a laser is a preferred light source 56, other light sources and receivers can be used. For example, a white light source may be used to illuminate the surface to be inspected and a receiver, such as a video receiver, receives an image of the surface. A processor coupled to the receiver electronically compares the received image against a known good image. Alternatively, dark field illumination techniques can be used.

Figure 3:
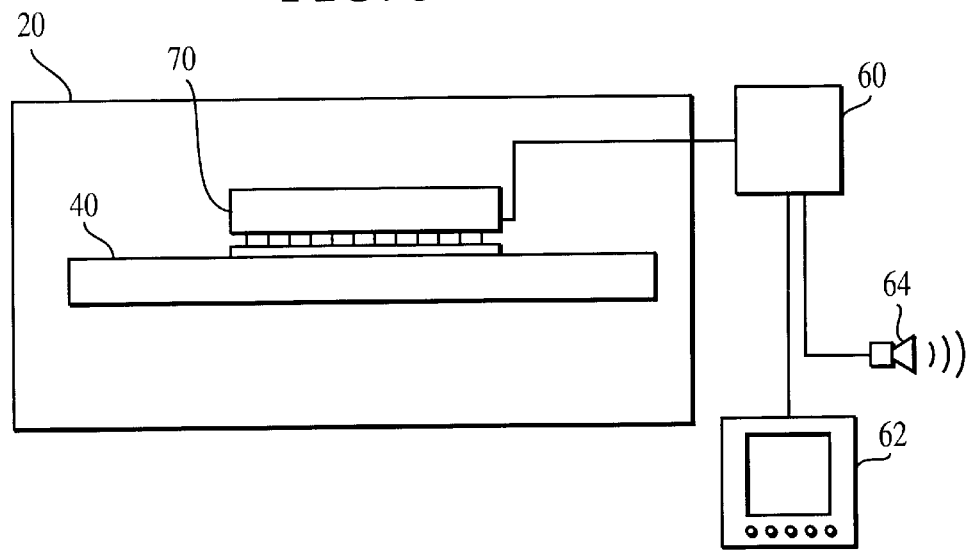
FIG. 3 illustrates an electrical testing station disposed inside the inspection chamber.
Figure 4:
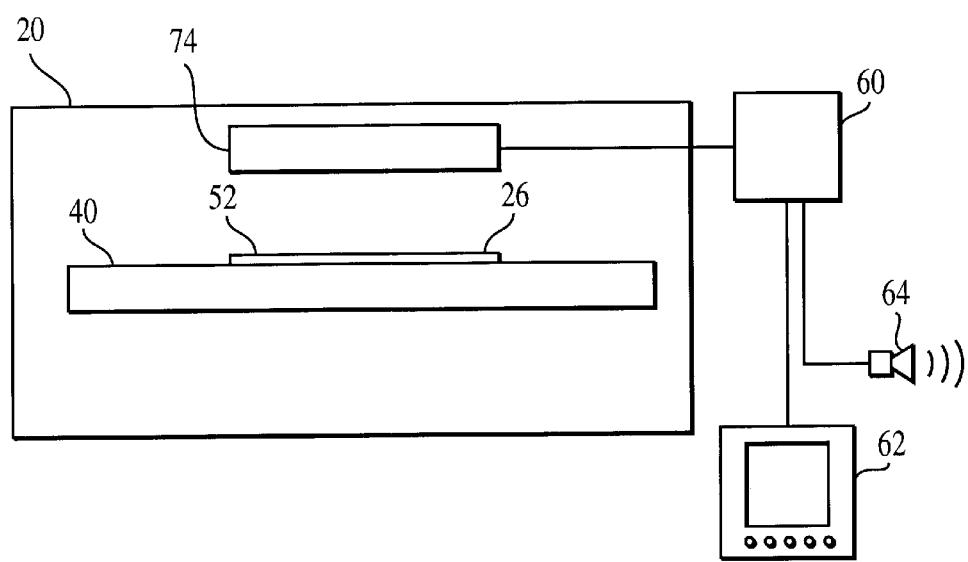
FIG. 4 illustrates equipment for inspecting for defects in the dimensions of features on a wafer.

The inspection station 34 has been described with respect to an inspection device for detecting large scale defects, but the invention is not limited thereto. The station can also include other inspection devices. For example, the inspection station 34 can also include test equipment 70 (FIG. 3) for performing electrical function tests or inspection equipment 74 (FIG. 4) for detecting defects in the dimensions of features formed on the semiconductor wafer 26. Other possible inspection equipment includes appropriate apparatus for optical inspection of oxidation induced stacking faults or pattern comparison inspection. In fact, any inspection process that is typically performed during or after a semiconductor wafer manufacturing process can be performed at the inspection station 34.

The invention also includes a method of inspecting semiconductor wafers. The method includes the steps of adding an inspection station 34 to the cluster tool 10 and positioning the semiconductor wafer 26 at the inspection station 34 for inspection.

Figure 5:
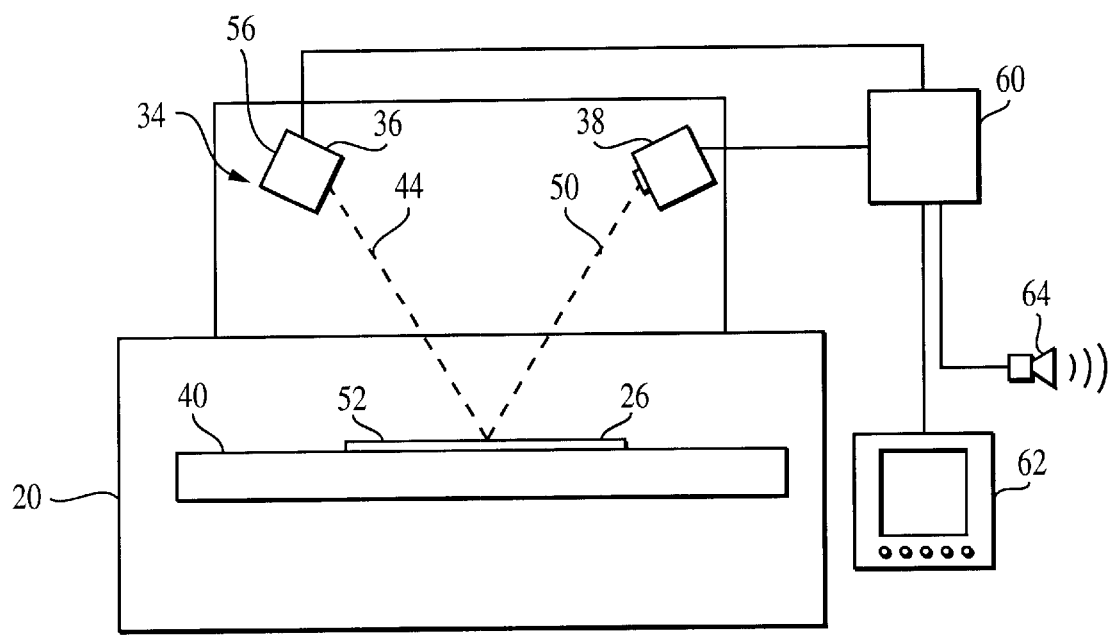
FIG. 5 illustrates an inspection station disposed outside the inspection chamber.

The inspection station 34 can be located inside the housing 12 or in an inspection chamber 20 connected to the cluster tool 10. In preferred embodiments of the invention, the inspection station 34 is located in an inspection chamber 20 that includes an interior region in fluid communication with the interior region 14 of the housing 12. Advantageously, the semiconductor wafer 26 is inspected without being exposed to ambient atmosphere whether the inspection station 34 is disposed in the housing 12 or in an adjacent inspection chamber 20. Alternatively, the inspection station 34 can be located outside the chamber, as illustrated in FIG. 5, and view the wafer through a transparent window.

The invention also includes the step of inspecting the wafer 26 and warning an operator when a defect is detected.

According to one aspect of the invention, the inspecting step can include an optical, or visual, inspection or an electrical inspection. The warning can include an audio signal, a visual signal or both.

It will be understood that the inspection station can be located in central housing of the cluster tool, instead of a separate inspection chamber. In that case, the light source and receiver can be attached to the inside of the housing and disposed to inspect the wafer as the transport mechanism transports the wafer to or from one or more of the processing chambers 18. It will also be understood that defects in the semiconductor wafer includes defects in material deposited on the semiconductor wafer during the fabrication process.

The above descriptions and drawings are only illustrative of the preferred embodiments which present the features and advantages of the present invention, and it is not intended that the present invention be limited thereto. Any modification of the present invention which comes within the spirit and scope of the following claims is considered part of the present invention.

What is claimed as new and desired to be protected by Letters Patent of the United States is:

1. A semiconductor wafer inspection station comprising:
   a cluster tool; and
   a wafer inspection station attached to the cluster tool;
   said cluster tool comprising a housing having an interior region and an inspection chamber attached to the housing for receiving the semiconductor wafer for inspection, the inspection station being disposed in the inspection chamber; and
   said inspection chamber comprising a rotatable wafer-receiving chuck, wherein all portions of said chuck are completely within said inspection chamber, and said inspection station comprising a Light source positioned to illuminate the semiconductor wafer when the semiconductor wafer is positioned on the chuck, an image detector for receiving light that is reflected by the semiconductor wafer, and a processor for processing the detected image to detect defects as small as about 0.2 to about 0.5 microns in the semiconductor wafer.

2. The inspection station of claim 1 wherein the inspection station comprises an image detector for detecting an image of the semiconductor wafer, and a processor for processing the detected image to detect defects in the semiconductor wafer.

3. The inspection station of claim 1 wherein the inspection station includes an electrical tester for testing electrical functions of the semiconductor wafer.

4. The inspection station of claim 1 wherein the inspection station includes a detector for detecting defects in the dimensions of features formed on the semiconductor wafer.

5. The semiconductor wafer inspection station of claim 1, wherein said chuck is rotatable during illumination and inspection of said wafer.

6. A cluster tool for handling a semiconductor wafer comprising:
   a housing;
   a mechanism within said housing for transporting semiconductor wafers and depositing the wafers on a rotatable wafer-receiving chuck for inspection;
   an inspection chamber coupled to the housing; and
   an inspection station disposed in the inspection chamber for detecting defects as small as about 0.2 to about 0.5 microns in the semiconductor wafer;
   said inspection chamber comprising said rotatable wafer-receiving chuck where said chuck is completely within said inspection chamber, and said inspection station comprising a light source positioned to illuminate the semiconductor wafer when the semiconductor wafer is positioned on the chuck, an image detector for receiving light that is reflected by the semiconductor wafer, and a processor for processing the detected image to detect said defects in the semiconductor wafer.

7. The cluster tool of claim 6, wherein said chuck is rotatable during illumination and inspection of said wafer.

8. A semiconductor wafer inspection station comprising:
   a cluster tool having a transport device for manipulating the semiconductor wafer;
   a light source coupled to the cluster tool;
   an image detector coupled to the cluster tool;
   a rotatable wafer-receiving chuck associated with said light source and said image detector, said chuck being completely within an inspection chamber, said inspection chamber housing said inspection station and said light source being positioned to illuminate the semiconductor wafer when the semiconductor wafer is deposited on the chuck by the transport device, and said image detector being positioned for receiving light that is reflected by the semiconductor wafer; and
   a processor coupled to the image detector for processing an image detected by the image detector to detect defects as small as about 0.2 to about 0.5 microns in the semiconductor wafer.

9. The inspection station of claim 8 wherein the light source includes a laser disposed at the cluster tool to illuminate a surface of the semiconductor wafer.

10. The inspection station of claim 8 wherein the processor provides an alarm signal to alert an operator when a defect is detected.

11. An inspection station for detecting large scale defects in a semiconductor wafer comprising:
   a laser light source for providing a laser light beam and for sweeping said laser light beam back-and-forth over said semiconductor wafer;
   a transport device for depositing the semiconductor wafer on a rotatable wafer receiving chuck where the wafer receives and reflects the laser light beam, said chuck being completely within said inspection station; and
   a receiver for receiving laser light reflected from the semiconductor wafer when positioned at said rotatable wafer-receiving chuck,
   the laser light source, transport device, rotatable wafer-receiving chuck, and receiver being located at a cluster tool.

12. The inspection station of claim 11, wherein said chuck is rotatable while receiving said light beam.

13. An inspection station for inspecting a semiconductor wafer comprising:
   a wafer inspection chamber attached to a cluster tool, said inspection chamber comprising a rotatable wafer-receiving chuck, wherein the entire chuck is within said inspection chamber;
   a defect detector disposed in the inspection chamber, said defect detector comprising a light source positioned to illuminate the semiconductor wafer with sweeping laser light when the semiconductor wafer is positioned on the rotatable wafer-receiving chuck while said chuck is rotating, and an image detector for receiving light that is reflected by the semiconductor wafer.

14. A method for inspecting a semiconductor wafer comprising the steps of:

positioning a semiconductor wafer in a cluster tool having an inspection station attached thereto;

moving the semiconductor wafer by a transport device from a process/reaction chamber to the inspection station for inspection;

depositing said semiconductor wafer upon a rotatable wafer-receiving chuck using said transport device, said chuck being completely within said inspection station, said chuck being associated with a light source positioned to illuminate said semiconductor wafer and an image detector positioned to receive light reflected from said semiconductor wafer;

rotating said chuck while said wafer is deposited thereon; and illuminating said semiconductor wafer with said light source while said chuck is rotating.

15. The method of claim 14 further including the step of inspecting a circuit formed on the surface of the wafer for detects.

16. A method for processing a semiconductor wafer comprising the steps of:

providing a cluster tool having a transport device for moving semiconductor wafers;

depositing said semiconductor wafer upon a rotatable wafer-receiving chuck using said transport device, said chuck being associated with a laser light source positioned to illuminate said semiconductor wafer and an image detector positioned to receive light reflected from said semiconductor wafer; and inspecting the wafer before it leaves the cluster tool, said inspecting comprising rotating said chuck while said semiconductor wafer is deposited thereon and illuminating said semiconductor wafer with a sweeping laser light from said laser light source while said chuck is rotating.

17. The method of claim 16 wherein the step of inspecting includes the step of optically inspecting the surface state of the wafer.

18. The method of claim 16 wherein the step of inspecting includes the step of inspecting the dimensions of elements on a surface of the semiconductor wafer.

19. The method of claim 16 wherein the cluster tool includes an inspection chamber comprising said rotatable wafer-receiving chuck, and the inspecting step includes the step of transporting the semiconductor wafer to the inspection chamber for inspection.

20. The method of claim 16 wherein the inspecting step includes the steps of detecting a defect in the semiconductor wafer and warning an operater when the defect is detected.

21. The method of claim 20 wherein the warning step includes the step of sending a warning signal to at least one of an audio warning device and a visual warning device.

22. The method of claim 16, wherein said inspecting of the wafer can detect defects as small as about 0.2 to about 0.5 microns.

23. A method of processing a semiconductor wafer comprising the steps of:

providing a cluster tool having a transport device;

providing a process chamber coupled to the cluster tool;

providing an inspection station having a rotatable wafer-receiving chuck, coupled to the cluster tool, said chuck being arranged to receive said wafer within said inspection station, and said chuck being associated with a light source positioned to illuminate said semiconductor wafer and an image detector positioned to receive light reflected from said semiconductor wafer, said combination of said light source and said image detector being able to detect defects of said wafer that are as small as 0.5 microns; and transporting the semiconductor wafer using the transport device from the process chamber to the rotatable wafer receiving chuck inside said inspection station.

\* \* \* \* \*

UNITED STATES PATENT AND TRADEMARK OFFICE
CERTIFICATE OF CORRECTION

PATENT NO.     : 6,424,733 B2
DATED          : July 23, 2002
INVENTOR(S)    : Rodney C. Langley It is certified that error appears in the above-identified patent and that said Letters Patent is hereby corrected as shown below:

<u>Title page,</u>
Item [57], ABSTRACT,
Line 6, "process/reacto" should read -- process/reaction --

<u>Column 5,</u>
Line 34, "Light" should read -- light --

Signed and Sealed this

Seventeenth Day of June, 2003

JAMES E. ROGAN
*Director of the United States Patent and Trademark Office*